US012622078B2

(12) United States Patent
Hsu et al.

(10) Patent No.: US 12,622,078 B2
(45) Date of Patent: May 5, 2026

(54) CHIP PACKAGE STRUCTURE

(71) Applicant: TONG HSING ELECTRONIC INDUSTRIES, LTD., Taipei City (TW)

(72) Inventors: Jui-Hung Hsu, Hsin-Chu County (TW); Li-Chun Hung, Hsin-Chu County (TW); Chien-Chen Lee, Hsin-Chu County (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 372 days.

(21) Appl. No.: 18/217,681

(22) Filed: Jul. 3, 2023

(65) Prior Publication Data

US 2024/0234457 A1 Jul. 11, 2024

(30) Foreign Application Priority Data

Jan. 11, 2023 (TW) .................................. 112101116

(51) Int. Cl.
*H10F 39/00* (2025.01)
(52) U.S. Cl.
CPC ....... *H10F 39/8057* (2025.01); *H10F 39/804* (2025.01); *H10F 39/806* (2025.01); *H10F 39/811* (2025.01)
(58) Field of Classification Search
CPC .. H10F 39/8057; H10F 39/804; H10F 39/811; H10F 39/806
See application file for complete search history.

(56) References Cited

U.S. PATENT DOCUMENTS

| | | | |
|---|---|---|---|
| 8,575,634 B2 | 11/2013 | Liu et al. | |
| 8,633,558 B2 | 1/2014 | Lin et al. | |
| 11,133,348 B2 | 9/2021 | Hung et al. | |
| 2012/0211852 A1* | 8/2012 | Iwafuchi | H10F 39/8057 |
| | | | 257/435 |
| 2020/0350357 A1* | 11/2020 | Hung | H01L 24/26 |
| 2024/0204018 A1* | 6/2024 | Hsu | H10F 39/8057 |
| 2024/0363655 A1* | 10/2024 | Fan | H10F 39/804 |

FOREIGN PATENT DOCUMENTS

| | | | |
|---|---|---|---|
| JP | S6398661 U | * | 6/1988 |
| JP | 6398661 U | | 6/1998 |
| TW | 202042354 A | | 11/2020 |

* cited by examiner

*Primary Examiner* — David Vu
*Assistant Examiner* — Brandon C Fox
(74) *Attorney, Agent, or Firm* — Li & Cai Intellectual Property (USA) Office

(57) ABSTRACT

A chip package structure includes a substrate, a chip, a light-permeable element, a first anti-reflective layer, and an adhesive element. The chip is disposed on the substrate. The light-permeable element is disposed above the chip. The light-permeable element has a first surface and a second surface opposite to each other, and the first surface faces the chip. The first anti-reflective layer covers at least part of the first surface. The adhesive element is connected between the chip and the light-permeable element, and the adhesive element separates the chip and the light-permeable element. The adhesive element and the first anti-reflective layer are not in contact with each other.

10 Claims, 6 Drawing Sheets

CHIP PACKAGE STRUCTURE

CROSS-REFERENCE TO RELATED PATENT APPLICATION

This application claims the benefit of priority to Taiwan Patent Application No. 112101116, filed on Jan. 11, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package structure, and more particularly to a chip package structure capable of improving structural strength.

BACKGROUND OF THE DISCLOSURE

In the conventional chip-level sensor package structure, such as a complementary metal oxide semiconductor (CMOS), a glass element used as an upper cover is fixed on a substrate by an adhesive. The adhesive acts as a supporting wall structure that hermetically surrounds a sensing chip. However, an upper surface and a lower surface of the glass element are respectively coated with an anti-reflection film, and the adhesive is directly adhered to the anti-reflection film. The anti-reflection film is relatively fragile, so as to be easily torn by the adhesive during the curing process. In addition, any crack existing in the adhesive will extend from the interface between the adhesive and the anti-reflection film to the anti-reflection film, thereby causing the anti-reflection film to peel off.

Therefore, how to improve structural strength through the improvement of the chip packaging structure and overcome the above-mentioned inadequacy has become an important issue to be addressed in the related art.

SUMMARY OF THE DISCLOSURE

In response to the above-referenced technical inadequacy, the present disclosure provides a chip package structure.

In one aspect, the present disclosure provides a chip package structure, which includes a substrate, a chip, a light-permeable element, a first anti-reflection layer, and an adhesive element. The chip is disposed on the substrate. The light-permeable element is disposed above the chip. The light-permeable element includes a first surface and a second surface that are opposite to each other, and the first surface faces the chip. The first anti-reflective layer covers at least part of the first surface. The second anti-reflective layer covers the second surface. The adhesive element is connected between the chip and the light-permeable element, the adhesive element separates the chip and the light-permeable element, and the adhesive element and the first anti-reflective layer are not in contact with each other.

Therefore, in the chip package structure provided by the present disclosure, by virtue of "the first anti-reflective layer covering at least part of the first surface," and "the adhesive element and the first anti-reflective layer being not in contact with each other," the first anti-reflective layer can avoid being torn and peeled off by the adhesive element, and an overall structural strength of the chip package structure can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
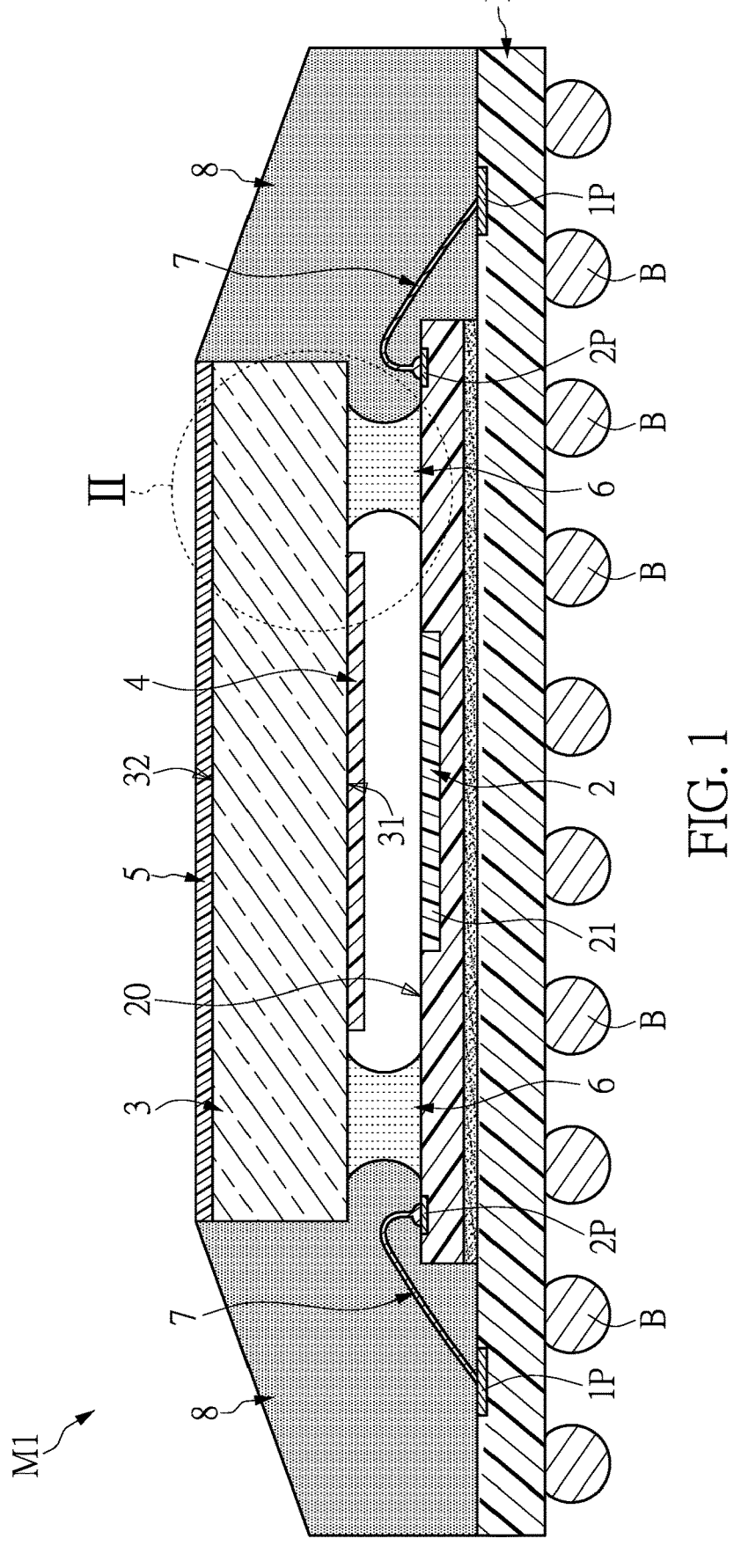
FIG. 1 is a schematic exploded view of a chip package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
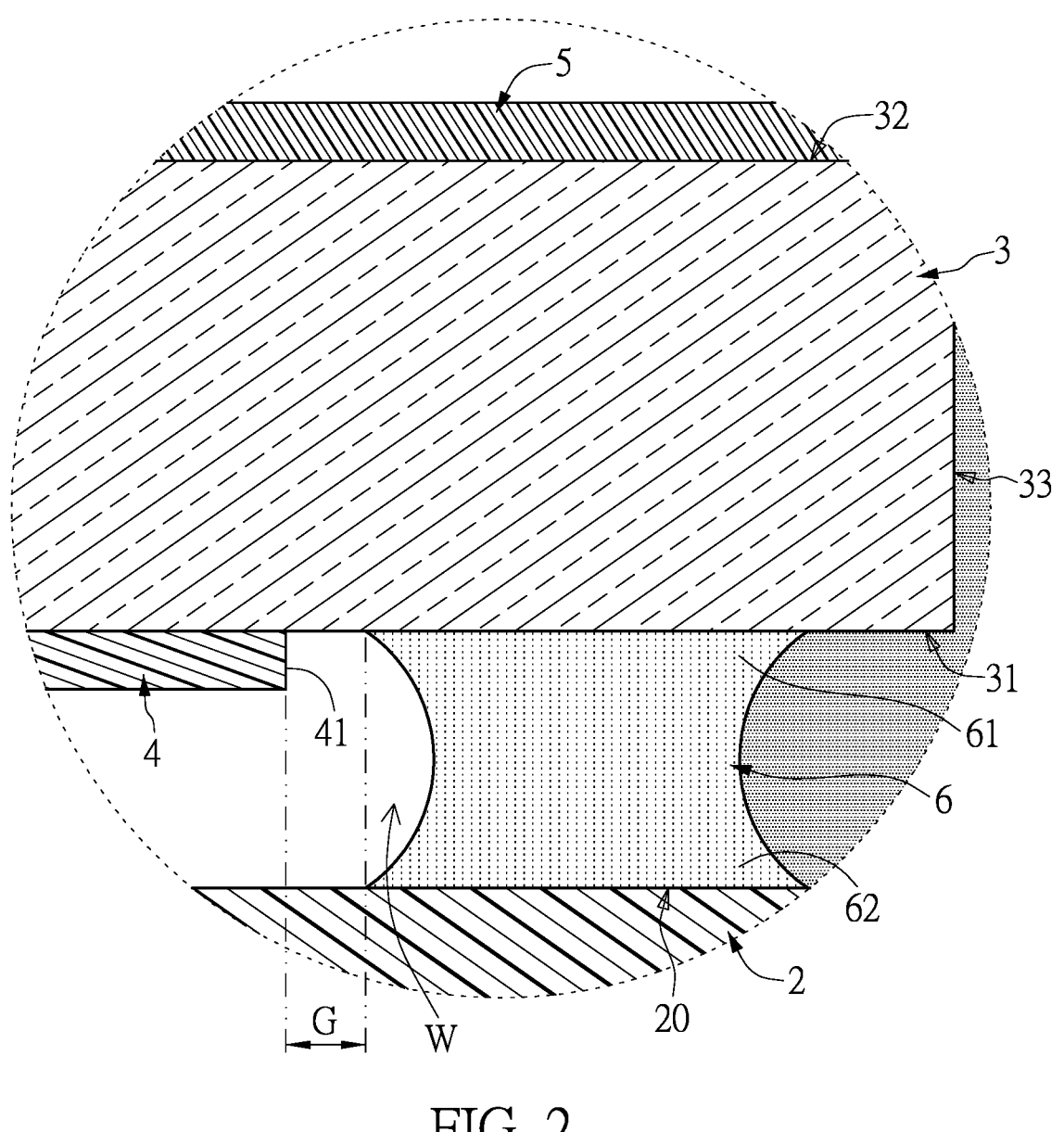
FIG. 2 is a schematic enlarged view of part II of FIG. 1.

Referring to FIG. 1 and FIG. 2, a first embodiment of the present disclosure provides a chip package structure M1, which includes a substrate 1, a chip 2, a light-permeable element 3, a first anti-reflective layer 4, a second anti-reflective layer 5, and an adhesive element 6. The chip 2 is disposed on the substrate 1, and a plurality of solder balls B may be further provided on a lower surface of the substrate 1. The chip package structure M1 can be soldered on an electronic component (not shown in the figures) through a plurality of solder balls B, such that the chip package structure M1 can be electrically connected to the electronic component. The light-permeable element 3 is disposed above the chip 2. The light-permeable element 3 has a first surface 31 and a second surface 32 that are opposite to each other, and the first surface 31 faces the chip 2. The first anti-reflective layer 4 covers at least part of the first surface 31. The second anti-reflective layer 5 covers the second surface 32. The adhesive element 6 is connected between the chip 2 and the light-permeable element 3, and the adhesive element 6 separates the chip 2 and the light-permeable element 3. Furthermore, the adhesive element 6 surrounds the chip 2 to form an accommodating space. In other words, the chip 2 is positioned in the accommodating space.

The substrate 1 can, for example, be formed from a ceramic material. The light-permeable element 3 can be formed from transparent glass. The adhesive element 6 can be formed from an opaque adhesive material such as epoxy resin. However, the present disclosure is not limited thereto.

Each of the first anti-reflective layer 4 and the second anti-reflective layer 5 is a surface optical coating layer. When light pass through the light-permeable element 3 and is received by an image sensing region 21 of the chip 2, the first anti-reflective layer 4 and the second anti-reflective layer 5 can reduce reflection of light to increase light transmittance. In the present disclosure, a thickness of each of the first anti-reflective layer 4 and the second anti-reflective layer 5 ranges from 200 nm and 1000 nm, but the present disclosure is not limited thereto.

In addition, for example, the chip 2 may be an image sensing die, such as a complementary metal oxide semiconductor (CMOS) sensing die having the image sensing region 21 on a surface thereof, but the present disclosure is not limited thereto. The chip package structure M1 further includes a plurality of metal wires 7, and the plurality of metal wires 7 are electrically connected between the chip 2 and the substrate 1. Specifically, one end of each of the metal wires 7 is connected to a conducting portion 2P of the chip 2, and another end of each of the metal wires 7 is connected to a pad 1P of the substrate 1. Therefore, the substrate 1 can be electrically coupled to the chip 2 through the plurality of metal wires 7. Moreover, any of the metal wires 7 can be formed by normal bonding or reverse bonding, and the present disclosure is not limited thereto.

The chip package structure M1 further includes an encapsulation colloid 8, and the encapsulation colloid 8 is disposed on the substrate 1. The chip 2, the adhesive element 6, the light-permeable element 3, the first anti-reflective layer 4, and the plurality of metal wires 7 are embedded within the encapsulation colloid 8. The second surface 32 of the light-permeable element 3 is exposed from the encapsulation colloid 8. The encapsulation colloid 8 can be a liquid compound or a molding compound, and the present disclosure is not limited thereto.

As shown in the FIG. 1, the first anti-reflective layer 4 does not completely cover the first surface 31 of the light-permeable element 3, but partially covers a middle portion of the first surface 31. As shown in the FIG. 2, the first anti-reflective layer 4 forms a window W at an uncovered portion of the first surface 31. Specifically, the window W refers to an area where the first surface 31 is located between a lateral edge 33 of the light-permeable element 3 and a lateral edge 41 of the first anti-reflective layer 4. The adhesive element 6 includes a first end 61 and a second end 62. The first end 61 is disposed in the window W and directly connected to the first surface 31. The second end 62 is connected to the second surface 20 of the chip 2. Furthermore, an edge of the window W (i.e., the lateral edge 41 of the first anti-reflective layer 4) and the adhesive element 6 are spaced apart from a gap G formed therebetween. Therefore, the adhesive element 6 and the first anti-reflective layer 4 are not in contact with each other. In the first embodiment, a width of the gap G ranges between one-tenth and one-sixth of the average width of the adhesive element 6.

Accordingly, the adhesive element 6 and the first anti-reflective layer 4 are not in contact with each other through the design of the gap G, so as to prevent the first anti-reflective layer 4 from being pulled by the adhesive element 6 and tearing, and prevent cracks existing in the adhesive element 6 from extending to the first anti-reflective layer 4 and causing it to peel.

Second Embodiment

Figure 3:
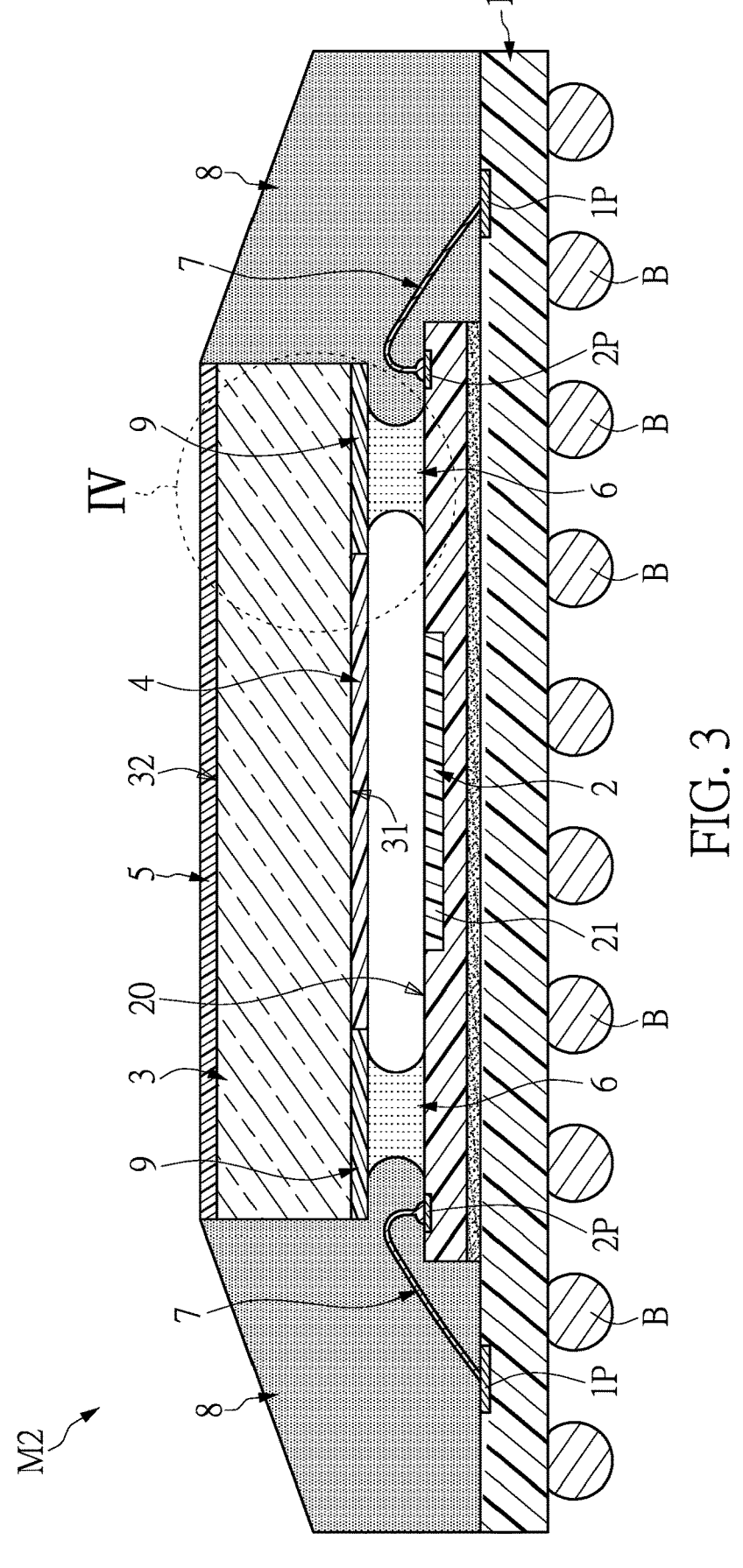
FIG. 3 is a schematic exploded view of a chip package structure according to a second embodiment of the present disclosure.
Figure 4:
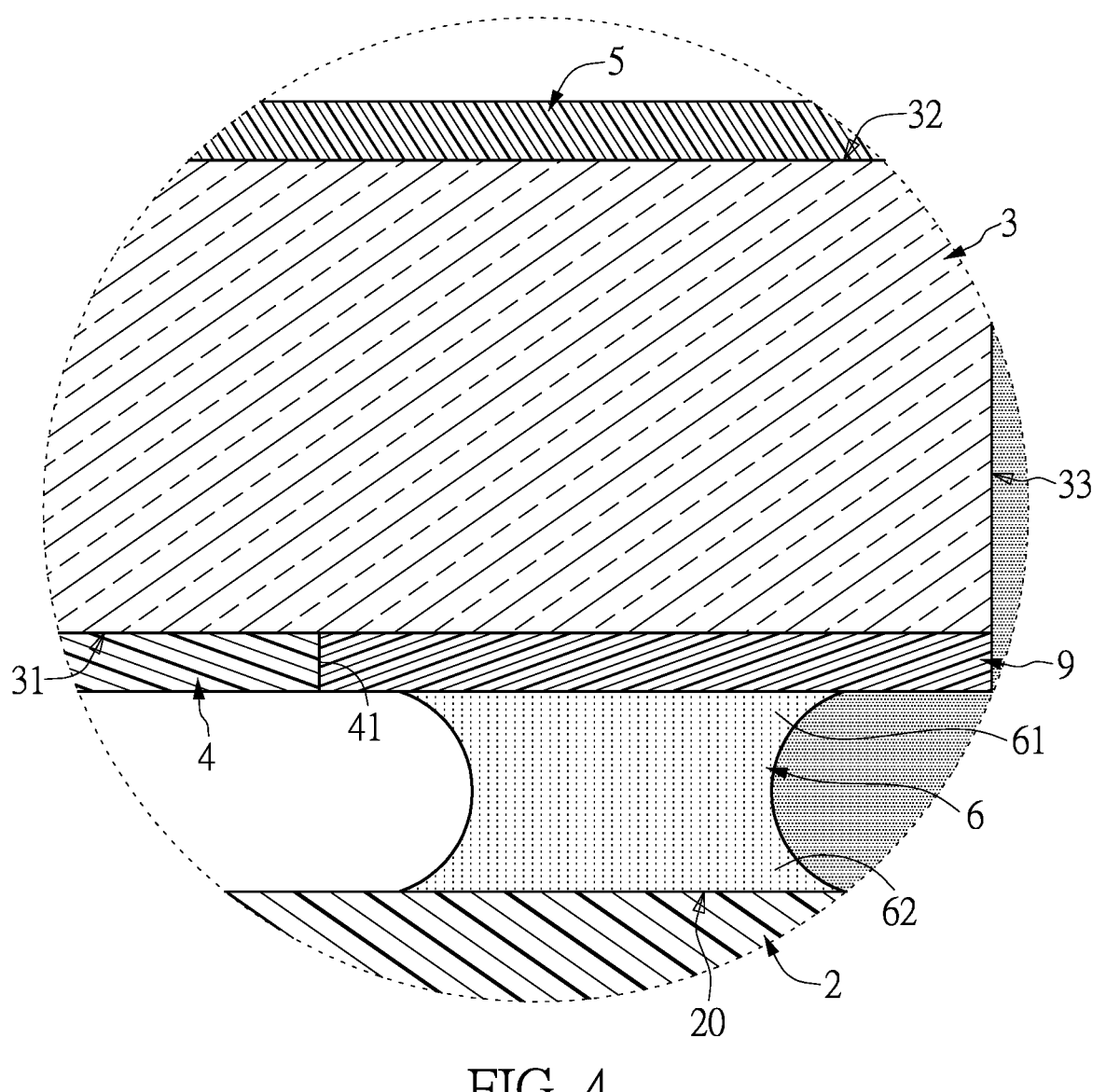
FIG. 4 is a schematic enlarged view of part IV of FIG. 3.

Referring to FIG. 3 and FIG. 4, a second embodiment of the present disclosure provides a chip package structure M2, which includes a substrate 1, a chip 2, a light-permeable element 3, a first anti-reflective layer 4, and a second anti-reflective layer 5, an adhesive element 6, a plurality of metal wires 7, and an encapsulation colloid 8. From a comparison between FIG. 3 and FIG. 1, it can be observed that the chip package structure M2 of the second embodiment has a structure similar to that of the chip package structure M1 of the first embodiment, and the similarities will not be reiterated herein. The main difference between the first and second embodiments is that the chip package structure M2 further includes a shielding layer 9. For example, the shielding layer 9 can be made of a photoresist, a black mask, or other black adhesive materials, and the present disclosure is not limited thereto. Moreover, a thickness of the shielding layer 9 is less than 15 μm, and the present disclosure is not limited thereto.

In continuation of the above, the shielding layer 9 can be formed at an outer side of the first surface 31 of the light-permeable element 3 by sputtering, and can be located between the light-permeable element 3 and the adhesive element 6. However, the way that the shielding layer 9 is formed is not limited in the present disclosure. The shielding layer 9 and the first anti-reflective layer 4 do not overlap with each other. As shown in FIGS. 3 and 4, the first end 61 of the adhesive element 6 is connected to the shielding layer 9, and the second end 62 of the adhesive element 6 is connected to the surface 20 of the chip 2. The shielding layer 9 can be capable of blocking light. The first anti-reflective layer 4 can be prevented from being pulled by the shielding layer 9 to cause the peeling through the way that the shielding layer 9 and the first anti-reflective layer 4 do not overlap with each other (i.e., the shielding layer 9 is directly formed on the surface of the light-permeable element 3).

It is worth mentioning that the shielding layer 9 that is illustrated in FIGS. 3 and 4 is not intended to limit its actual size. In other embodiments, the width of the shielding layer 9 can be increased (i.e., the width of the first anti-reflective layer 4 can be reduced). However, an orthogonal projection of the shielding layer 9 that is projected onto the first surface 31 of the light-permeable element 3 and an orthogonal projection of the image sensing region 21 that is projected onto the first surface 31 do not overlap with each other, so as to prevent the light from being blocked by the shielding layer 9 while passing into the light-permeable element 3 and being unable to be received by the image sensing region 21.

Third Embodiment

Figure 5:
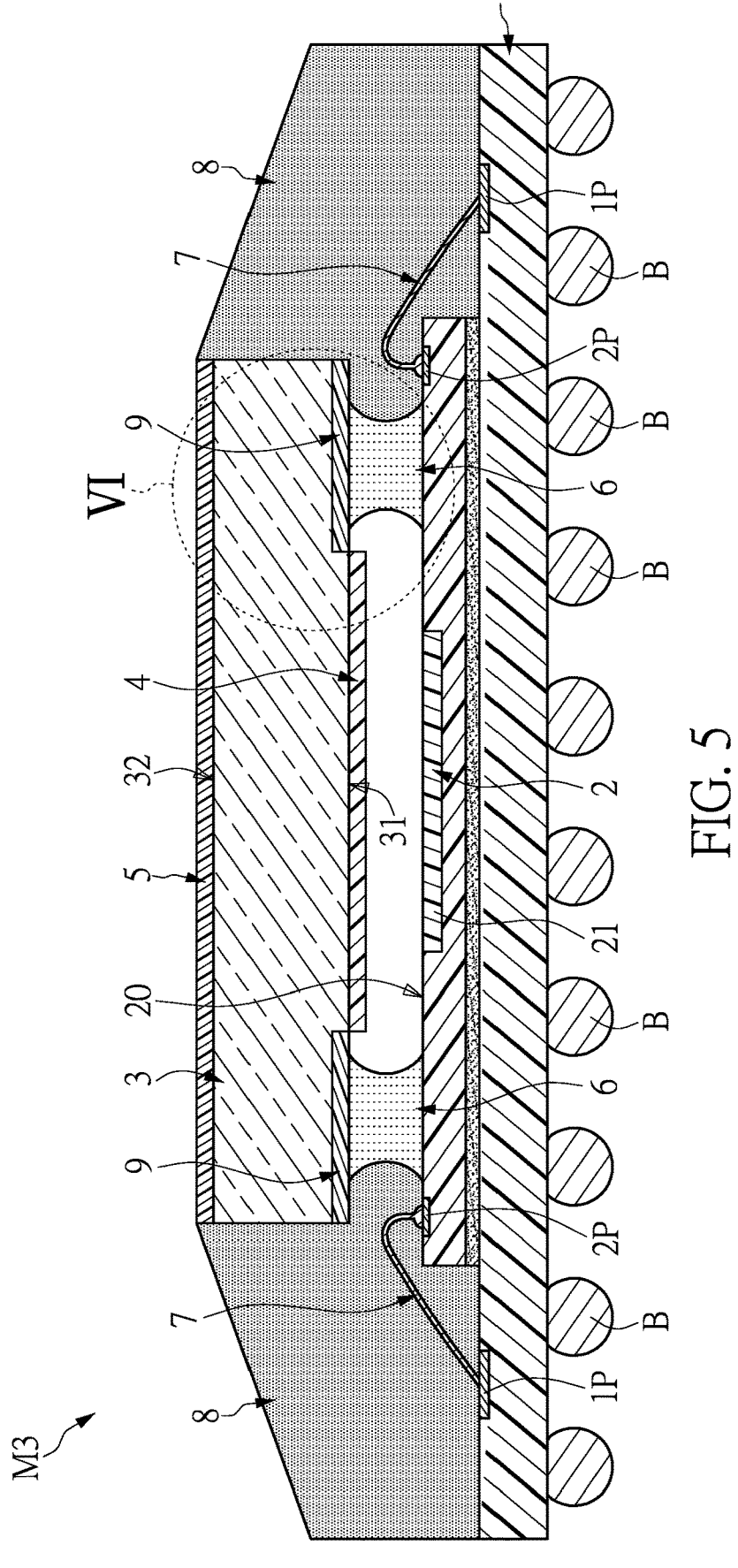
FIG. 5 is a schematic exploded view of a chip package structure according to a third embodiment of the present disclosure.
Figure 6:
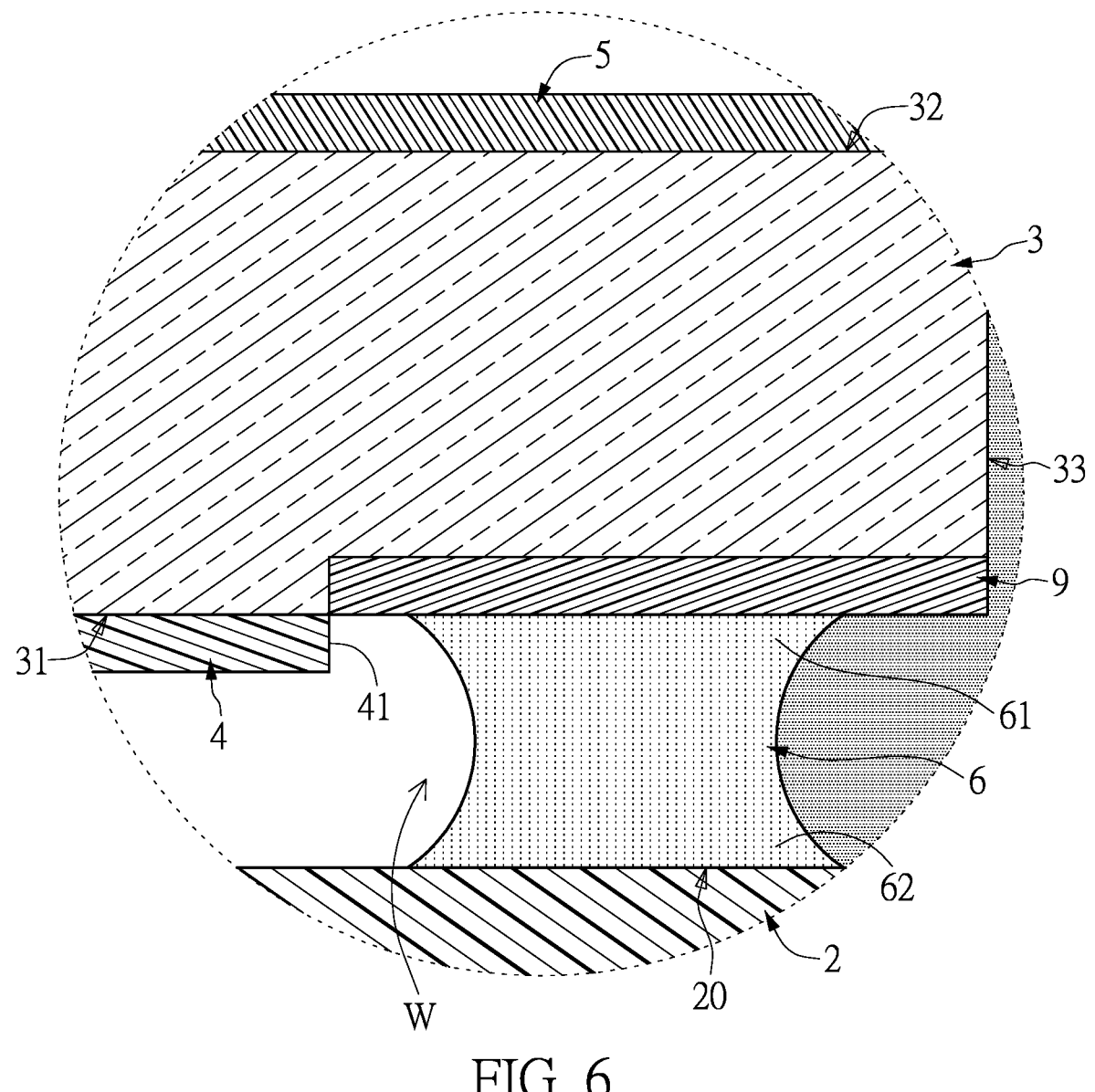
FIG. 6 is a schematic enlarged view of part VI of FIG. 5.

Referring to FIG. 5 and FIG. 6, a third embodiment of the present disclosure provides a chip package structure M3, which includes a substrate 1, a chip 2, a light-permeable element 3, a first anti-reflective layer 4, and a second anti-reflective layer 5, an adhesive element 6, a plurality of metal wires 7, and an encapsulation colloid 8. From a comparison between FIG. 5 and FIG. 3, it can be observed that the chip package structure M3 of the third embodiment has a structure similar to that of the chip package structure M2 of the second embodiment, and the similarities will not be reiterated herein. The main difference between the second and third embodiments is that the position of the shielding layer 9 is different. In the third embodiment, the shielding layer 9 can be formed at an inner side of the first surface 31 of the light-permeable element 3 by sputtering. In other words, the first end 61 of the adhesive element 6 is disposed in the window W that is formed at the first anti-reflective layer 4 and directly contacts the outer side of the first surface 31 of the light-permeable element 3 (i.e., the adhesive element 6 and the shielding layer 9 are respectively connected to two opposite sides of the first surface 31), and the second end 62 of the adhesive element 6 is connected to the surface 20 of the chip 2.

Beneficial Effects of the Embodiments

In conclusion, in the chip package structures M1 to M3 provided by the present disclosure, by virtue of the adhesive element 6 and the first anti-reflective layer 4 being not in contact with each other, the first anti-reflective layer 4 will not be torn and peeled off by the adhesive element 6. In addition, the first anti-reflective layer 4 can be prevented from being pulled by the shielding layer 9 to cause the peeling through the way that the shielding layer 9 and the first anti-reflective layer 4 do not overlap with each other (i.e., the shielding layer 9 is directly formed on the surface of the light-permeable element 3).

Compared with the adhesive element 6 or the shielding layer 9 that are directly connected to the first anti-reflective layer 4, which can cause the first anti-reflective layer 4 to be easily torn in the related art, the chip package structures M1 to M3 provided by the present disclosure can prevent the first anti-reflective layer 4 from being peeled, thereby improving the overall structural strength of the chip package structures M1 to M3.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip package structure, comprising:
a substrate;
a chip disposed on the substrate;
a light-permeable element disposed above the chip, wherein the light-permeable element includes a first surface and a second surface that are opposite to each other, and the first surface faces the chip;
a first anti-reflective layer covering at least part of the first surface;
a second anti-reflective layer covering the second surface; and
an adhesive element connected between the chip and the light-permeable element, wherein the adhesive element separates the chip and the light-permeable element, and the adhesive element and the first anti-reflective layer are not in contact with each other;
wherein the first anti-reflective layer forms a window, the adhesive element includes a first end and a second end, the first end is disposed in the window and directly connected to the first surface, and the second surface is connected to a surface of the chip;
wherein a gap is formed between an edge of the window and the adhesive element, the adhesive element has an average width, and a width of the gap ranges from one-tenth to one-sixth of the average width.

2. The chip package structure according to claim 1, wherein a thickness of each of the first anti-reflective layer and the second anti-reflective layer ranges from 200 nm and 1000 nm.

3. The chip package structure according to claim 1, further including a plurality of metal wires, and the plurality of metal wires are electrically connected between the chip and the substrate.

4. The chip package structure according to claim 3, further comprising an encapsulation colloid disposed on the substrate, wherein the chip, the adhesive element, the light-permeable element, the first anti-reflective layer, and the plurality of metal wires are embedded within the encapsulation colloid, and the second surface of the light-permeable element is exposed from the encapsulation colloid.

5. A chip package structure, comprising:
a substrate;
a chip disposed on the substrate;
a light-permeable element disposed above the chip, wherein the light-permeable element includes a first surface and a second surface that are opposite to each other, and the first surface faces the chip;
a first anti-reflective layer covering at least part of the first surface;
a second anti-reflective layer covering the second surface;
a shielding layer formed at an inner side of the first surface; and
an adhesive element connected between the chip and the light-permeable element, wherein the adhesive element separates the chip and the light-permeable element, and the adhesive element and the first anti-reflective layer are not in contact with each other;
wherein the first anti-reflective layer forms a window, the adhesive element includes a first end and a second end, the first end is disposed within the window and directly connected to an outer side of the first surface, such that the adhesive element and the shielding layer are respectively located at two opposite sides of the first surface, and the second end is connected to a surface of the chip.

6. The chip package structure according to claim 5, wherein the shielding layer and the first anti-reflective layer do not overlap with each other.

7. The chip package structure according to claim 5, wherein the chip includes an image sensing region, and an orthogonal projection of the shielding layer that is projected onto the first surface and an orthogonal projection of the image sensing region that is projected onto the first surface do not overlap with each other.

8. A chip package structure, comprising:

a substrate;

a chip disposed on the substrate;

a light-permeable element disposed above the chip, wherein the light-permeable element includes a first surface and a second surface that are opposite to each other, and the first surface faces the chip;

a first anti-reflective layer covering a part of the first surface, wherein the first anti-reflective layer forms a window;

a second anti-reflective layer covering the second surface;

a shielding layer covering another part of the first surface and disposed within the window, wherein the shielding layer surrounds and is connected to the first anti-reflective layer; and an adhesive element connected between the chip and the light-permeable element, wherein the adhesive element separates the chip and the light-permeable element, and the adhesive element and the first anti-reflective layer are not in contact with each other;

wherein the adhesive element includes a first end and a second end, the first end is directly connected to the shielding layer, and the second end is connected to a surface of the chip.

9. The chip package structure according to claim 8, wherein the shielding layer and the first anti-reflective layer do not overlap with each other.

10. The chip package structure according to claim 8, wherein the chip includes an image sensing region, and an orthogonal projection of the shielding layer that is projected onto the first surface and an orthogonal projection of the image sensing region that is projected onto the first surface do not overlap with each other.

* * * * *